United States Patent
Jang et al.

(10) Patent No.: US 9,963,772 B2
(45) Date of Patent: May 8, 2018

(54) INTERIOR MATERIAL FOR THIN FILM DEPOSITION DEVICE AND METHOD FOR MANUFACTURING SAME

(71) Applicant: KOMICO CO., LTD., Anseong-si, Gyeonggi-do (KR)

(72) Inventors: Sung Soo Jang, Anseong-si (KR); Hyun Chul Ko, Anseong-si (KR); Kyung Ic Jang, Anseong-si (KR); Sung Jin Choi, Anseong-si (KR)

(73) Assignee: KOMICO CO., LTD., Anseong-si, Gyeonggi-Do (KR)

( * ) Notice: Subject to any disclaimer, the term of this patent is extended or adjusted under 35 U.S.C. 154(b) by 0 days. days.

(21) Appl. No.: 15/317,238

(22) PCT Filed: Jun. 4, 2015

(86) PCT No.: PCT/KR2015/005620
§ 371 (c)(1),
(2) Date: Dec. 8, 2016

(87) PCT Pub. No.: WO2015/190752
PCT Pub. Date: Dec. 17, 2015

(65) Prior Publication Data
US 2017/0137924 A1    May 18, 2017

(30) Foreign Application Priority Data

Jun. 11, 2014 (KR) .................. 10-2014-0070970
Jul. 28, 2014 (KR) .................. 10-2014-0095593

(51) Int. Cl.
*C23C 4/08*      (2016.01)
*C23C 14/56*    (2006.01)
(Continued)

(52) U.S. Cl.
CPC .............. *C23C 4/08* (2013.01); *C23C 4/129* (2016.01); *C23C 4/134* (2016.01); *C23C 14/564* (2013.01);
(Continued)

(58) Field of Classification Search
CPC ...... H01J 37/3447; C23C 14/564; C23C 4/08; C23C 4/129; C23C 4/134
(Continued)

(56) References Cited

U.S. PATENT DOCUMENTS 6,855,236 B2 * 2/2005 Sato ..................... C23C 4/00
                                                                118/715
7,554,052 B2 * 6/2009 Deem ............... H01J 37/32477
                                                                219/121.47
(Continued)

FOREIGN PATENT DOCUMENTS

EP      0 845 545        6/1998
JP      2004-072110      3/2004
(Continued)

OTHER PUBLICATIONS

Taiwanese Office Action with English Translation for Taiwanese Application No. 104118868 dated Jan. 8, 2016.
(Continued)

*Primary Examiner* — Rodney G McDonald
(74) *Attorney, Agent, or Firm* — Kile Park Reed & Houtteman PLLC (57) ABSTRACT

An internal member for an apparatus of depositing a conductive thin film includes a chamber structure including a object supporting unit supporting an object on which the conductive thin film is to be deposited, and a target supporting unit supporting a target for depositing the conductive thin film on the object, wherein the target including a first metal material the chamber structure having a reaction space therein and a coating structure formed on an inner surface of the chamber structure, the inner surface being indirectly
(Continued)

exposed to the reaction space of the chamber structure via the coating structure, and the coating structure including a second metal material having at least one metal element in the first metal material.

16 Claims, 5 Drawing Sheets

(51) Int. Cl.
*C23C 4/129* (2016.01)
*C23C 4/134* (2016.01)
*H01L 21/285* (2006.01)
*H01L 21/3205* (2006.01)
*H01L 21/768* (2006.01)

(52) U.S. Cl.
CPC .. *H01L 21/28506* (2013.01); *H01L 21/32051* (2013.01); *H01L 21/76838* (2013.01)

(58) Field of Classification Search
USPC ............. 204/298.11; 427/446, 449, 455, 456
See application file for complete search history.

(56) References Cited

U.S. PATENT DOCUMENTS

| | | | |
|---|---|---|---|
| 2002/0086554 | A1 | 7/2002 | O'Donnell et al. |
| 2006/0110620 | A1* | 5/2006 | Lin .......................... C23C 4/02 428/650 |

FOREIGN PATENT DOCUMENTS

| | | |
|---|---|---|
| JP | 2008-522031 | 6/2008 |
| JP | 2010-236094 | 10/2010 |
| JP | 2012-094645 | 5/2012 |
| KR | 10-2013-0018957 | 2/2013 |

OTHER PUBLICATIONS

International Search Report for International Application No. PCT/KR2015/005620, dated Aug. 31, 2015.

* cited by examiner

INTERIOR MATERIAL FOR THIN FILM DEPOSITION DEVICE AND METHOD FOR MANUFACTURING SAME

CROSS-REFERENCE TO RELATED APPLICATIONS

This application claims priority under 35 USC § 119 to Korean Patent Application Nos. 10-2014-0070970 filed on Jun. 11, 2014 and 10-2014-0095593 filed on Jul. 28, 2014, the contents of which are herein incorporated by reference in its entirety.

TECHNICAL FIELD

The present disclosure relates to an internal member for an apparatus of depositing a conductive thin film and a method of manufacturing the same, and more particularly, an internal member for an apparatus depositing a conductive thin film or a metal compound so as to form a circuit pattern on a substrate in a vacuum chamber by a physical vapor deposition process such as sputtering process and to a method of manufacturing the same.

BACKGROUND ART

In general, a semiconductor device is manufactured by forming a circuit pattern on a semiconductor substrate such as a wafer. For example, the circuit pattern is formed by processes including a vacuum deposition process. Here, a wire or an electrode is formed by depositing a conductive thin film on the semiconductor substrate using a conductive material such as aluminum (Al), titanium (Ti), molybdenum (Mo), tungsten (W) or a metal compound such as molybdenum silicide (MoSi2), titanium nitride (TiN), tantalum nitride (TaN).

In the vacuum deposition process, the conductive material or the metal compound for forming the wire, electrode, or the like may be evaporated to be unintentionally deposited on parts included a vacuum deposition apparatus for the process. Thus, sediments may be unstably attached to the parts. Thus, the sediments may be detached from the parts to generate particles in a process chamber to act as the particles in the deposition process, thus resulting in a failure of the wire or the electrode and reduce uniformity of the conductive thin film formed on the semiconductor substrate.

The deposit separated from the parts may inflow into the conductive thin film for forming the wire or the electrode, which may cause a short circuit or a defect in the wire or the electrode to lower an overall yield of a process of manufacturing the semiconductor device.

To solve this matter, it is possible to increase a binding force between the deposit and the parts through an anchoring effect while a binding area between the deposit and the parts is enlarged by increasing a surface roughness of the parts.

However, when each of the parts is formed with a high surface roughness, an amount of a raw material for forming the parts may be excessively required, which may cause an over-consumption of the raw material and further may deteriorate a durability of the vacuum deposition apparatus.

Thus, a wire arc spraying process has been applied to form a coating layer having a relatively high surface roughness on the parts. In the wire arc spraying process, it may be capable of minimizing the loss of the raw material for forming the parts, and maintaining the durability of the vacuum deposition apparatus to some extent. However, while performing the vacuum deposition process for forming the conductive thin film on the semiconductor substrate, the sediment may not be uniformly stacked on the parts along a specific growth direction due to the non-uniformity in the surface roughness and the shape of the coating layer. Thus, separations between the sediments and the coating layer may occur due to increase in an internal stress of each of the sediments. In addition, while the high surface roughness is achieved, particles may be formed by being disparted from the coating layer. A number of particles each having an unstable surface increase as a defect may occur in the coating layer. As a result, the particles may act as defects in the vacuum deposition process.

DETAILED DESCRIPTION OF THE INVENTION

Technical Problem

The present disclosure provides an internal member for an apparatus of depositing a conductive thin film, the internal member capable of stably collecting a deposit evaporated and deposited on components.

The present disclosure also provides a method of manufacturing the internal member for an apparatus of depositing a conductive thin film.

Technical Solution

In accordance with an exemplary embodiment, an internal member for an apparatus of depositing a conductive thin film, the internal member comprising a chamber structure including a object supporting unit supporting an object on which the conductive thin film is to be deposited, and a target supporting unit supporting a target for depositing the conductive thin film on the object, wherein the target including a first metal material the chamber structure having a reaction space therein and a coating structure formed on an inner surface of the chamber structure, the inner surface being indirectly exposed to the reaction space of the chamber structure via the coating structure, and the coating structure including a second metal material having at least one metal element in the first metal material.

In accordance with an exemplary embodiment, the second metal material may include at least one selected from the group consisting of aluminum (Al), titanium (Ti), molybdenum (Mo), tungsten (W), tantalum (Ta) and chromium (Cr).

In accordance with an exemplary embodiment, the coating structure may have a roughness ranging from about 10 μm to about 40 μm.

In accordance with an exemplary embodiment, a difference between a thermal expansion coefficient of the conductive thin film and that of the second metal material may be within about ±10%.

In accordance with an exemplary embodiment, the coating structure may include a first thin film thin film formed on the inner surface, the first thin film having a roughness ranging from about 10 μm to about 40 μm, and a second thin film thin film formed on the first thin film, the second thin film having the second metal material. Here, the inner surface of the chamber structure making contact with the first thin film may have a roughness ranging from about 2 μm to about 10 μm.

In accordance with an exemplary embodiment, a thermal expansion coefficient of the first thin film may be lower than or same as that of chamber structure, and may be higher than or same as that of the second thin film.

In accordance with an exemplary embodiment, a porosity of the first thin film may be higher than or same as that of the second thin film. Besides, the first thin film may have a porosity ranging from about 6% to about 12% and the second thin film may have a porosity ranging from about 2% to about 8%.

In accordance with an exemplary embodiment, the first thin film may have a thickness ranging from about 50 μm to about 500 μm and the second thin film may have a thickness ranging from about 20 μm to about 80 μm.

In accordance with an exemplary embodiment, the coating structure may include a third thin film on the inner surface and in an assembly area in which parts included from the chamber structure are assembled with each other, the third thin film having roughness a ranging from about 2 μm to about 10 μm, the parts including the object supporting unit and the target supporting unit. Here, the third thin film may have a thickness ranging from about 20 μm to about 300 μm.

According to an exemplary embodiment of a method of manufacturing an internal member for an apparatus of depositing a thin film, a chamber structure is prepared, the chamber structure including an object supporting unit supporting an object on which the thin film is to be deposited, and a target supporting unit supporting a target for depositing the conductive thin film on the object, the target including a first metal material, and the chamber structure having a reaction space therein. Then, an inner surface exposed to the reaction space is coated with a second metal material to form a coating structure on the inner surface, the second metal material having at least one metal element in the first metal material.

In accordance with an exemplary embodiment, the coating an inner surface may be formed by any one method among a plasma spray method, a high velocity oxygen fuel spray method (HVAF), a high velocity air fuel spray method (HVAF).

In accordance with an exemplary embodiment, the second metal material may include at least one selected from the group consisting of aluminum (Al), titanium (Ti), molybdenum (Mo), tungsten (W), tantalum (Ta) and chromium (Cr).

In accordance with an exemplary embodiment, before coating the inner surface with the second metal material, the inner surface exposed to the reaction space is blast processed to form a blasted inner surface having a roughness ranging from about 2 μm to about 10 μm.

Advantageous Effects

According to an internal member for an apparatus of depositing a thin film and a method of manufacturing the same, since a coated layer is formed on an inner surface of a chamber structure exposed to a reaction space of the chamber structure, with a metal material including a target for forming a thin film on a object, in a process of depositing the thin film on the object by using the target, by-products evaporated and deposited on the inner surface may be stably collected through the coating structure with a strong binding force. Accordingly, since it is possible to prevent a process problem in which the thin film by-products evaporated and deposited on the inner surface of the chamber structure is peeled off from the inner surface to contaminate the object, the present disclosure may greatly contribute to quality improvement of semiconductor chips and a display device manufactured from the object as well as increase a production yield of the semiconductor chips and the display device.

BEST MODE OF THE INVENTION

Hereinafter, with reference to drawings, it will be described in detail an internal member for an apparatus of depositing a conductive thin film and a method of manufacturing the same according to an embodiment of the present inventive concept. Exemplary embodiments of the inventive concept will be described below in more detail with reference to the accompanying drawings. The inventive concept may, however, be embodied in different forms and should not be construed as limited to the embodiments set forth herein. However, this is not intended to limit the embodiments according to the inventive concept as the specific disclosed forms; rather it should be understood that all of variations, equivalents or substitutes contained in the concept and technical scope of the present invention are also included. In the drawings, like reference numerals refer to like elements throughout. In the drawings, the dimensions of structures are exaggerated for clarity of illustration.

Though terms like "first" and "second" are used to describe various components, the components are not limited to these terms. These terms are used only to differentiate one component from another one. For example, without departing from the scope of the inventive concept, a first element could be termed a second element, and similarly has a second element could be termed a first element.

In the following description, the technical terms are used only for explaining a specific exemplary embodiment while not limiting the present invention. The terms of a singular form may include plural forms unless referred to the contrary. Throughout the specification, when it is said that a part "includes" or "have", it means that the part may further intend to designate features, integers, steps, operations, elements, components, or the combination thereof. Further, it means that one or more other features, integers, steps, operations, elements, parts or combinations thereof, or the additional possibility are not precluded.

The terms used in embodiments of the present invention can be interpreted as meaning commonly known to those skilled in the art unless defined otherwise. In general, the terms defined in the dictionary should be considered to have the same meaning as the contextual meaning of the related art, and, unless clearly defined herein, should not be understood abnormally or excessively formal meaning.

Figure 1:
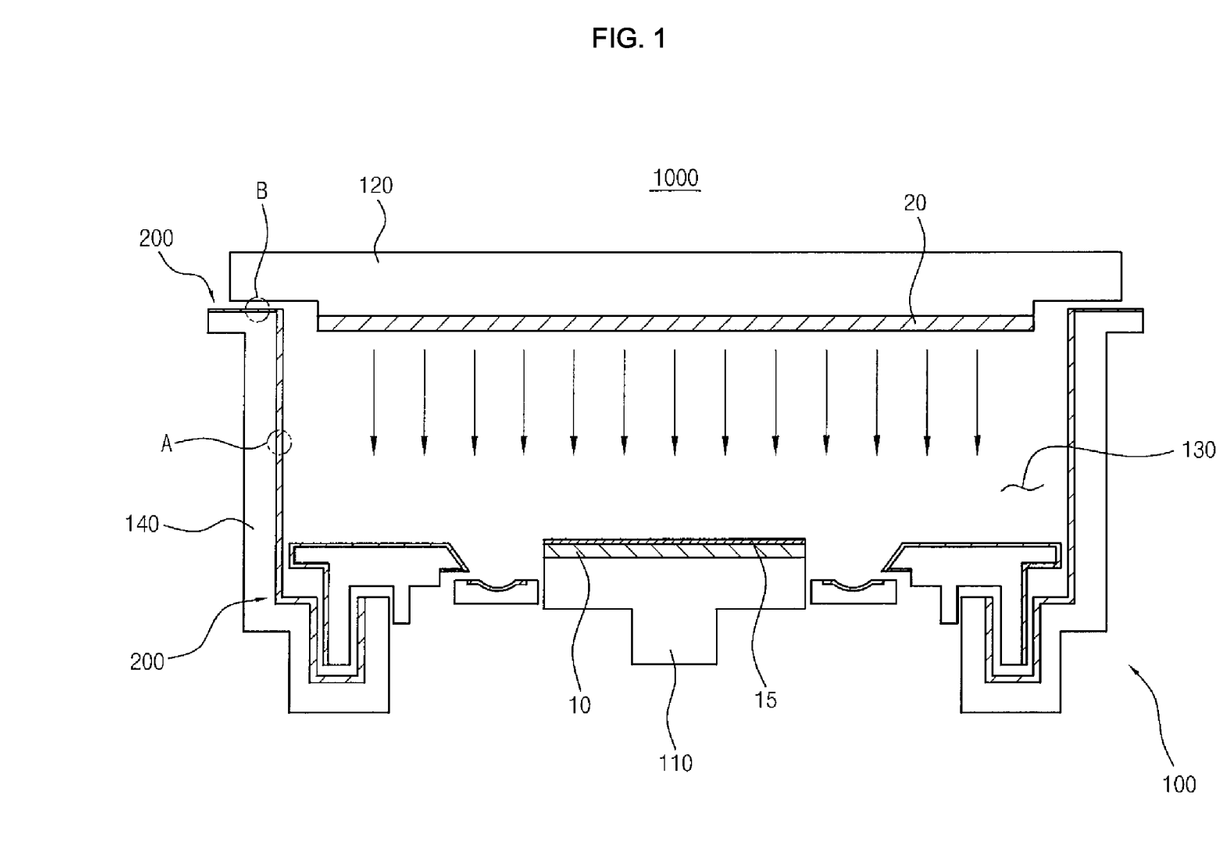
FIG. 1 illustrates a cross sectional view of an internal member for an apparatus of depositing a conductive thin film in accordance with an embodiment of the present invention.
Figure 2:
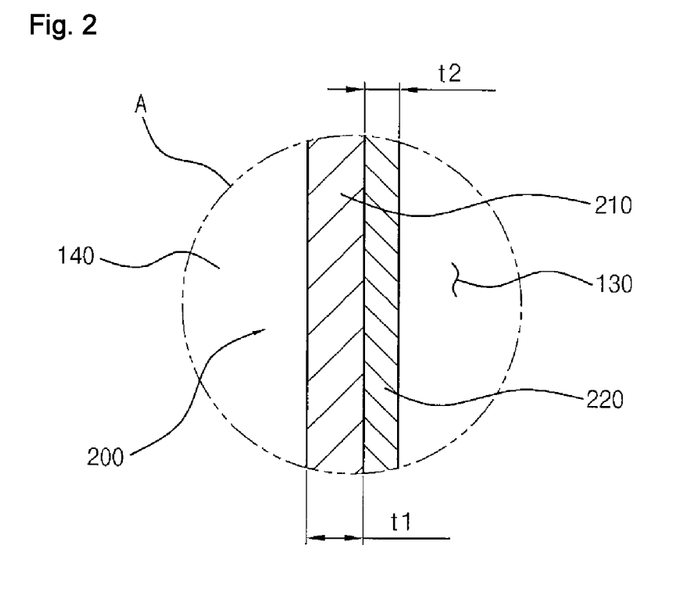
FIG. 2 illustrates an enlarged view of portion "A" of FIG. 1.
Figure 3:
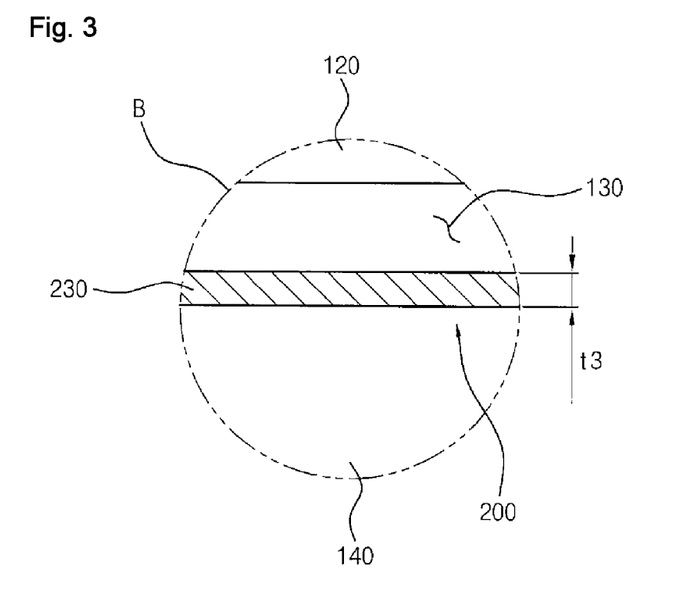
FIG. 3 illustrates an enlarged view of portion "B" of FIG. 1.

FIG. 1 illustrates a schematic view of an internal member for an apparatus of depositing a conductive thin film in accordance with an exemplary embodiment, FIG. 2 illustrates an enlarged view of portion "A" of FIG. 1, and FIG. 3 illustrates an enlarged view of portion "B" of FIG. 1.

Referring to FIGS. 1 to 3, an internal member 1000 for an apparatus of depositing a conductive thin film in accordance with an exemplary embodiment includes a chamber structure 100 for the apparatus of depositing a conductive thin film, the chamber structure a reaction space 130, and a coating structure 200. In the reaction space, a vacuum deposition process like a sputter process is performed. Further, by-products like floating particles may occur during the vacuum deposition process.

The chamber structure 100 includes a object supporting unit 110 disposed at a lower portion thereof and on which an object 10 is placed, and a target supporting unit 120 disposed at an upper portion thereof and supporting a target 20 for forming a conductive thin film 15 on the object 10. Herein, the object 10 may include a variety of substrates requiring a vacuum deposition process, such as a semiconductor substrate for fabricating semiconductor chips or a glass substrate for fabricating a display device.

The chamber structure 100 may include a side wall structure 140 which couples an end portion of the object supporting unit 110 with an end portion of the target supporting unit 120 in a vertical direction to form the reaction space 130. In addition, the chamber structure 100 may have a structure in which a plurality of components for performing a specific function such as gas injection, are additionally assembled. The chamber structure 100 may be formed of stainless metal (SUS) or aluminum (Al) which has excellent corrosion resistance and excellent heat resistance.

Herein the target 20 may include a first metal material. The first metal material may include aluminum (Al), titanium (Ti), molybdenum (Mo), tungsten (W), tantalum (Ta) or chromium (Cr). When the target 20 includes titanium (Ti), a plasma nitrogen gas (N2) may be injected into the reaction space 130 so that titanium (Ti) and nitrogen gas (N2) are reacted with each other to deposit titanium nitride (TiN) on the object 10. Similarly, molybdenum (Mo) and tantalum (Ta) among the target 20 may react with silicon (Si) and nitrogen gas (N2), respectively to deposit molybdenum silicide (MoSi2) and tantalum nitride (TaN) on the object 10. On the other hand, tungsten (W) among the target 20 may be deposited on the object 10 without any reaction.

The coating structure 200 is coated with a second metal material including on the inner surface of the chamber structure 100. The coating structure 200 is exposed to the reaction space 130 of the chamber structure 100. The second metal material includes at least one metal element in the first metal material. For example, when the first metal material includes aluminum, the second metal material includes aluminum. Further, the second metal material may be formed as a compound or an alloy which includes the first metal material included the target 20, such as aluminum (Al), titanium (Ti), molybdenum (Mo), tungsten (W), tantalum (Ta), and chromium (Cr).

When the coating structure 200 is formed of the second metal material including at least one element in the first metal material, the coating structure 200 may basically collect by-products which occur from the first metal material included the target 20 while the vacuum deposition process is performed such that the by-products are attached to the inner surface of the chamber structure 100 via the coating structure 200 since the coating structure 200 includes the second metal material having at least one metal substantially identical to the first metal material to achieve an excellent binding force between the coating structure 200 and the by-products while performing the vacuum deposition process is performed to form the conductive thin film 15 on the object 10 It is preferable that a difference between an thermal expansion coefficient of the conductive thin film 15 formed from the first metal material included the target 20 and that of the second metal material be within about ±10% so that the by-products are stably maintained intact to the coating structure 200 as collected.

Thus, the coating structure 200 may have a roughness ranging from about 10 μm to about 40 μm so as to collect the by-products with a relatively strong binding force. When the coating structure 200 has a roughness less than about 10 μm, the coating structure 200 is difficult to stably collect the by-products due to a very small surface area of the coating structure 200. So, it is not preferable that the coating structure 200 has a roughness less than about 10 μm. When the coating structure 200 has a roughness more than about 40 μm, the coating structure 200 itself may be peeled off from the inner surface of the chamber structure 100 due to a low binding force between the coating structure and the inner surface of the chamber structure 100. So, it is not preferable that the coating structure 200 has a roughness more than about 40 μm.

In addition, the coating structure 200 may include two thin films, i.e., a first thin film 210 and a second thin film 220 on the inner surface of the chamber structure 100 so as to more stably collect the by-products.

The first thin film 210 is coated with an intermediate metal material on the inner surface of the chamber structure 100. At this time, the inner surface of the chamber structure 100 coated with the first thin film 210 may have roughness ranging from about 2 μm to about 10 μm such that the first thin film 210 is coated with a stable binding force. When the inner surface has a roughness less than about 2 μm, the first thin film 210 may be difficult to be coated with a stable binding force due to a very small surface area of the inner surface. So, it is not preferable that the inner surface has the roughness less than about 2 μm. When the inner surface has a roughness more than about 10 μm, the inner surface of the chamber structure 100 may be severely damaged in a process of forming the inner surface having the roughness more than about 10 μm. So, it is not preferable that the inner surface has the roughness more than about 10 μm The first thin film 210 is coated so as to have a roughness ranging from about 10 μm to about 40 μm corresponding to total roughness of the coating structure 200 to play a role in forming the roughness of the coating structure 200. Thus, the first thin film 210 may have a thickness t1 ranging from about 50 μm to about 500 μm. When the first thin film 210 is less than about 50 μm (i.e., too thin) and thus the inner surface of the chamber structure 100 is exposed, stress is concentrated on the exposed sites, so that a peeling phenomenon may occur on the exposed sites. So, it is not preferable that the thickness t1 of the first thin film 210 is less than about 50 μm. When the thickness t1 of the first thin film 210 exceeds 500 μm (i.e., too thick), residual stress increases, and thus the first thin film 210 may be peeled off from the inner surface of the chamber structure 100. So, it is not preferable that the thickness t1 of the first thin film 210 exceeds about 500 μm.

The second thin film 220 is coated on the first thin film 210. The second thin film 220 is coated with the second metal material including at least one metal element included the first metal of the metal 20 while the roughness formed by the first thin film 210 is maintained. Thus, the by-products are substantially collected by the second thin film 220. That is, the coating structure 200 may not only improve a collection effect of the by-products according to the roughness of the first thin film 210, but also suppress the collected by-products from being peeled off from the second thin film 220 since a surface roughness is maintained intact by the second thin film 220 to minimize stress concentration.

Thus, the second thin film 220 may have a thickness t2 ranging from about 20 µm to about 80 µm for a stable coating. When the thickness t2 of the second thin film 220 is less than about 20 µm (i.e., too thin), the first thin film 210 may be exposed at a portion where the second thin film 220 is not formed uniformly. So, it is not preferable that the thickness t2 of the second thin film 220 is less than about 20 µm. When the thickness t2 of the second thin film 220 exceeds about 80 µm (i.e., relatively thick), the second thin film 220 is peeled off from the first thin film 210. So, it is not preferable that the thickness t2 of the second thin film 220 exceeds about 80 µm.

On the other hand, it is preferably that a thermal expansion coefficient of the intermediate metal material forming the first thin film 210 is lower than or same as that of the chamber structure 100 and is higher than or same as that of the second thin film 220 so that the intermediate metal material is thermally and stably bonded between the inner surface of the chamber structure 100 and the second thin film 220. For example, when the target metal 20 is formed of titanium (Ti) and the chamber structure 100 is formed of stainless steel (SUS) or aluminum (Al), the intermediate metal material may be formed of aluminum (Al). Then, heat generated in the reaction space 130 of the chamber structure 100 during the vacuum deposition process may be prevented from being transferred while buffering heat stress through the characteristics of the thermal expansion coefficient. That is, the heat generated during the vacuum deposition process is transferred to the inner surface of the chamber structure 100 to be able to prevent a phenomenon in which the first thin film 210 is peeled off from the inner surface of the chamber structure 100.

Although this embodiment describes that the thermal expansion coefficient is sequentially lowered from the inner surface of the chamber structure 100, the first thin film 210, and the second thin film 220, it may be appreciated that when a difference in thermal expansion coefficient between these components is within about 20%, a phenomenon in which the first thin film 210 is peeled off may be prevented to a predetermined extent.

Further, the second thin film 220 may have porosity ranging from about 2% to about 8% to act as a buffer so that the heat generated through the vacuum deposition process may not be transferred to the inner surface of the chamber structure 100. When the second thin film 220 has a porosity less than about 2%, the second thin film 220 may not withstand stress caused by the heat due to too low porosity and may be peeled off from the first thin film 210. So, it is not preferable that the second thin film 220 has a porosity less than about 2%. When the second thin film has a porosity more than about 8%, the second thin film 220 may have a low interlayer bonding force with the first thin film 210 to be peeled off from the first thin film 210. So, it is not preferable that the second thin film 220 has a porosity more than about 8%.

In a similar concept, the first thin film 210 may also have a porosity ranging from about 6 to about 12%. When the first thin film 210 has a porosity less than about 6%, the first thin film 210 may not withstand stress caused by the heat and may be peeled off from the inner surface of the chamber structure 100. So, it is not preferable that the first thin film 210 has a porosity less than about 6%. When the first thin film 210 has a porosity more than about 12%, the first thin film 210 may have low bonding force with the inner surface of the chamber structure 100 to be peeled off from the inner surface of the chamber structure 100. So, it is not preferable that the first thin film 210 has a porosity more than about 12%. At this time, in each of the porosities of the first and second thin films 210 and 220, it is preferable that the porosity of the first thin film 210 is essentially higher than or same as that of the second thin film 220 such that the first thin film 210 effectively performs a role as a buffer against the heat. Specifically, the reasons the porosity of the first thin film 210 should be higher than that of the second thin film 220 are as follows. It is important for the second thin film 220 directly exposed to the reaction space 130 to have a compact structure so as to improve inter-layer and intra-layer bonding forces. On the other hand, it is important for the first thin film 210 to lower thermal conductivity by pores formed therein to improve thermal durability of the chamber structure 100.

Meanwhile, as in FIG. 3, a third thin film 230 may be formed on an assembly area of coating structure 200 which are indirectly exposed to the reaction space 130. At the assembly area, the parts such as the object supporting unit 110, the target supporting unit 120, and the side wall structure 140 are assembled to form the chamber structure 100.

Therefore, it is preferable that the third thin film 230 has a thickness t3 of about 300 µm or less so that the excessive thickness of the third thin film 230 may cause the structural characteristic of the chamber structure 100 unstable. While the third thin film 230 has a thickness t3 of at least about 20 µm or more so that the assembled portion does not affect the chamber structure 100.

In addition, the third thin film 230 may have a roughness ranging from about 2 µm to about 10 µm so as to stably collect the by-products at the assembly area. When the third thin film 230 has a roughness less than about 2 µm, a surface area of the third thin film 230 may be too small to have difficulty in stably collecting the by-products. So, it is not preferable that the third thin film 230 has the roughness less than about 2 µm. When the third thin film 230 has the roughness more than about 10 µm, the parts making in contact with each other in the gap may be damaged. So, it is not preferable that the third thin film 230 has the roughness more than about 10 µm.

In this way, since the coating structure 200 is formed with second metal material including a metal element substantially identical to the first metal material included the target 20 for forming the conductive thin film 15 on the object 10 on the inner surface exposed to the reaction space 130 of the chamber structure 100, the by-products evaporated and deposited on the inner surface may be stably collected with a strong binding force through the coating structure 200 in a process of depositing the conductive thin film 15 on the object 10. Accordingly, since it is possible to prevent a process problem in which the by-products evaporated and deposited on the inner surface of the chamber structure 100 is peeled off from the inner surface to contaminate object 10, the present disclosure may greatly contribute to quality improvement of a semiconductor chip and a display device manufactured from the object 10 as well as increase a production yield of the semiconductor chip and the display device.

Hereinafter, a method of manufacturing an internal member 1000 for an apparatus depositing a thin film will be described in detail with further reference to FIG. 4.

Figure 4:
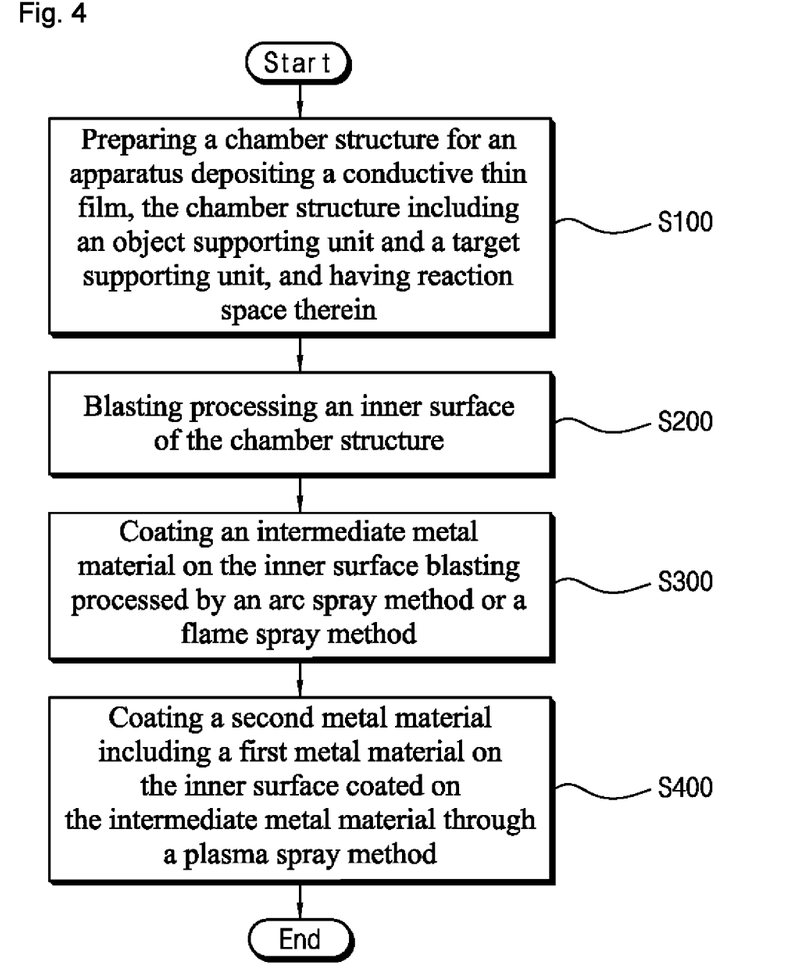
FIG. 4 is a flow chart showing a method of manufacturing an internal member for an apparatus of depositing a conductive thin film illustrated in FIG. 1.

FIG. 4 is a flow chart gradationally showing a method of manufacturing an internal member for an apparatus of depositing a thin film illustrated in FIG. 1.

With further reference to FIG. 4, in order to manufacture the internal member for an apparatus depositing a thin film, first prepared is a chamber structure 100 for an apparatus depositing a thin film (S100), the chamber structure 100 including a object supporting unit 110 having a member to be treated 10 placed thereon, a target supporting unit 120 supporting a target metal 20, and a side wall structure 140 coupling an end portion of the object supporting unit 110 with an end portion of the target supporting unit 120, and having a reaction space 130 therein. The chamber structure 100 may be formed of stainless metal (SUS) or aluminum (Al) which has excellent corrosion resistance and excellent heat resistance.

Next, an inner surface exposed to the reaction space of the chamber structure 100 is blasting processed so as to have a roughness ranging from about 2 μm to about 10 μm (S200). This operation is performed such that the first thin film 210 is coated on the inner surface of the chamber structure 100 with a sufficient surface area and a stable binding force.

Then, a first thin film is formed on the inner surface blasting processed in the chamber structure 100 by coating through an arc spray method or a flame spray method (S300). The first thin film may be formed using an intermediate metal material. Herein, the intermediate metal material preferably has a thermal expansion coefficient lower than or same as that of the inner surface so as to be thermally and stably bonded to the inner surface of the chamber structure 100.

At this time, in a process in which a conductive thin film 15 is formed on the object 10 from the target 20, the surface of the first thin film 210 may be formed with a roughness ranging about 10 μm to about 40 μm so as to collect the by-products to the coating structure 200. Thus, the by-products are attached to the inner surface exposed to the chamber structure 100 with a strong binding force. In addition, the first thin film 210 may be formed with a thickness t1 ranging from about 50 μm to about 500 μm according to the roughness thereof so that the inner surface of the chamber structure 100 is not damaged and is not peeled off form the inner surface thereof.

Next, a second metal material including at least one element included in the first metal material is coated on the first thin film 210 through a plasma spray method to form the second thin film 220 (S400). Herein, the second metal material may have a thermal expansion coefficient lower than or same as that of the intermediate metal material so as to be thermally and stably bonded to the first thin film 210.

At this time, the second thin film 220 is coated while the roughness formed by the first thin film 210 is maintained intact. In addition, the second thin film 220 may be coated with a thickness t2 ranging from about 20 μm to about 80 μm so as to be stably coated on the first thin film 210. Further, the second thin film 220 may be formed with a porosity ranging from about 2% to about 8% to perform a role as a buffer so that the heat generated through the vacuum deposition process may not be transferred to the inner surface of the chamber structure 100. As a result, the first thin film 210 may also have a porosity ranging from about 6% to about 8% as the second thin film 220 is formed to more effectively perform a role as a buffer against the heat.

In addition, when the second thin film 220 is coated on the first thin film 210, a variation in roughness of the first thin film 210 is decreased. Hereinafter, with further reference to FIGS. 5 to 7, this will be described in detail.

Figure 5:
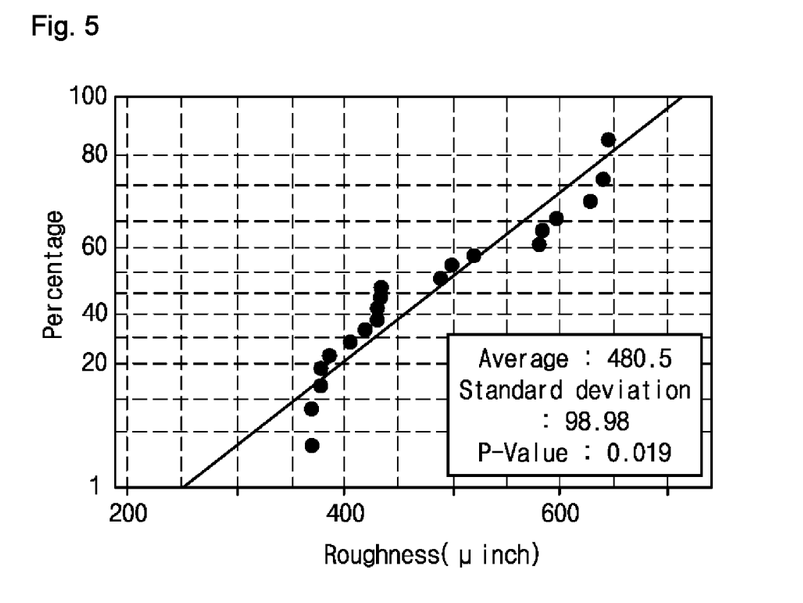
FIG. 5 shows a graph to check a deviation in roughness when only a first thin film is coated in the method shown in FIG. 4.
Figure 6:
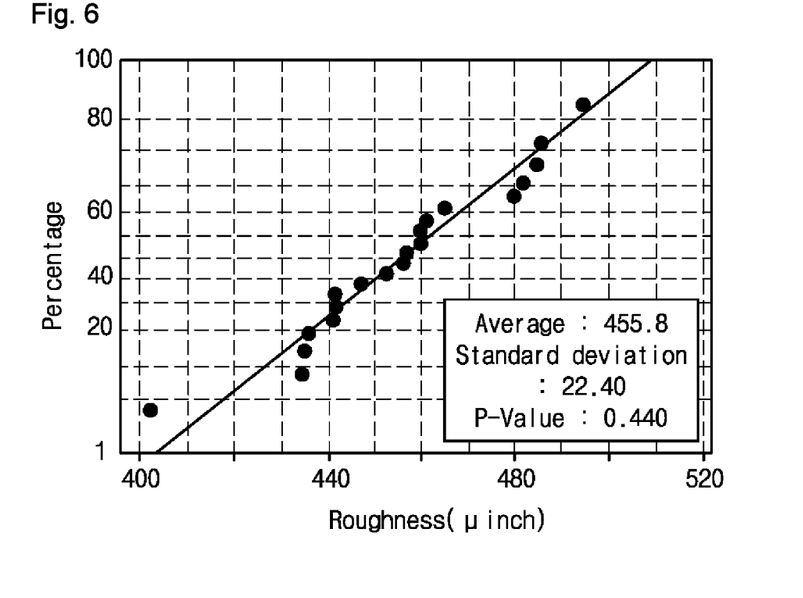
FIG. 6 shows a graph to check a deviation in roughness when a second thin film is coated on a first thin film in the method shown in FIG. 4.
Figure 7:
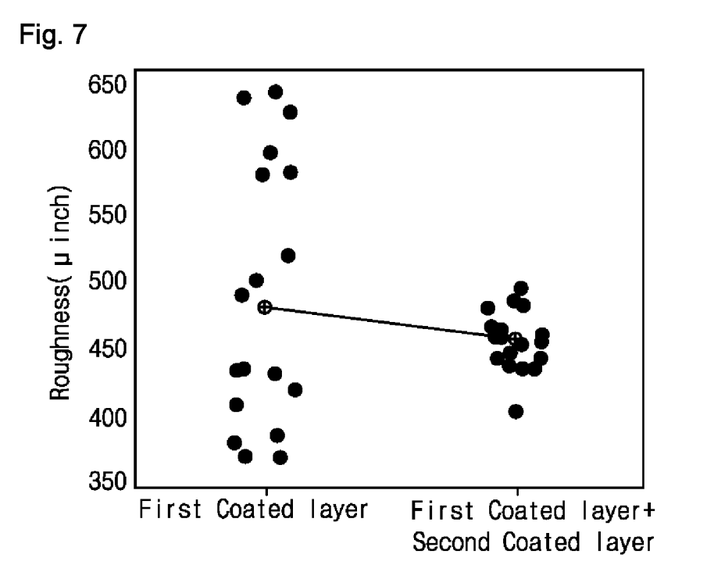
FIG. 7 is a graph showing a distribution in roughness when only the first thin film is coated in FIG. 5 and when the first and second thin films are coated in FIG. 6.

FIG. 5 shows a graph to check a deviation in roughness when only the first thin film is coated in the method shown in FIG. 4, and FIG. 6 shows a graph to check a deviation in roughness when the second thin film is coated on the first thin film in the method shown in FIG. 4, and FIG. 7 is a graph showing a distribution in roughness when only the first thin film is coated in FIG. 5 and when the first and second thin films are coated in FIG. 6.

With further reference to FIGS. 5 to 7, when only the first thin film 210 is arc coated with a thickness of about 150 μm of aluminum (Al) on the inner surface of the chamber structure 100, P-Value is 0.019 indicating a abnormal distribution and the standard deviation is 98.98 as shown in FIG. 5. On the other hand, when the first and second thin films 210 and 220 are respectively coated by an arc coating through aluminum (Al) and by a plasma spray method through titanium (Ti) with a thickness of about 150 μm and about 40 μm of on the inner surface of the chamber structure 100 in the named order, P-Value is 0.440 indicating a normal distribution and the standard deviation is 22.40 as shown in FIG. 6, and it is confirmed that the values are much lower than when only the only the first thin film 210 is coated.

Through this, when the first and second thin films 210 and 220 are coated on the inner surface of the chamber structure 100 in the order, it is confirmed that the thin film by-products may be collected with more stable bonding force as an overall roughness is uniformly distributed as shown in the graph of FIG. 7.

Specifically, when roughness uniformity of each of the first and second thin films 210 and 220 is degraded unlike the above embodiment, a phenomenon in which growth directions of the by-products collected on the second thin film 220 collide with each other to generate a concentration of stress so that the by-products collected on the second thin film 220 are separated from the second thin film 220 while the vacuum deposition process is in progress. That is, when an overall roughness of each of the first and second thin films 210 and 220 is uniformly distributed, the by-products may be grown in a uniform direction on the second thin film 220 to prevent stress from being concentrated.

Meanwhile, when the second thin film 220 is formed by any one of a plasma spray method, a high velocity oxygen fuel spray method (HVAF), or a high velocity air fuel spray method (HVAF), splat may be formed to have improved spreadability and excellent adhesion. At this time, the splat is preferably ranged from about 50 μm to about 200 μm in size so that the thin film by-products are uniformly grown.

Although this embodiment describes that the internal member 1000 for an apparatus depositing a thin film is manufactured by coating both of the first and second thin films 210 and 220 on the inner surface of the chamber structure 100, it may be understood that only the second thin film 220 except for the first thin film 210 may be coated on the inner surface of the chamber structure 100 in another form of the third thin film 230 with respect to parts to be assembled to form the chamber structure 100. For example, the parts include the object supporting unit 110, the target supporting unit 120, and the side wall structure 140 inside the chamber structure 100 as shown in FIG. 3.

While the present invention has been particularly shown and described with reference to exemplary embodiments thereof, it will be understood by those of ordinary skill in the art that various changes in form and details may be made therein without departing from the substantial features of the embodiments.

INDUSTRIAL APPLICABILITY

As described above in detail, since an internal member for an apparatus of depositing a thin film is manufactured by forming a coated layer on an inner surface of a chamber structure exposed to a reaction space of the chamber structure, with a metal material including a target for forming a thin film on a object, in a process of depositing the thin film on the object by using the target, by-products evaporated and deposited on the inner surface may be stably collected through the coating structure with a strong binding force, and then it is possible to prevent a process problem in which the thin film by-products evaporated and deposited on the inner surface of the chamber structure is peeled off from the inner surface to contaminate the object.

The invention claimed is:

1. An internal member for an apparatus of depositing a conductive thin film, the internal member comprising:
   a chamber structure including a object supporting unit supporting an object on which the conductive thin film is to be deposited, and a target supporting unit supporting a target for depositing the conductive thin film on the object, wherein the target includes a first metal material and the chamber structure has a reaction space therein; and
   a coating structure formed on an inner surface of the chamber structure, the coating structure covering the inner surface to be unexposed to the reaction space of the chamber structure, and the coating structure including a second metal material having at least one metal element included in the first metal material of the target,
   wherein the coating structure comprises:
     a first thin film formed on the inner surface of the chamber structure; and
     a second thin film formed on the first thin film, the second thin film including the second metal material, wherein a roughness formed by the first thin film is maintained in the second thin film, and
   wherein a thermal expansion coefficient of the first thin film is lower than or same as that of the chamber structure, and is higher than or same as that of the second thin film for preventing heat generated in the reaction space from being transferred to the inner surface of the chamber,
   wherein a porosity of the first thin film is higher than or same as that of the second thin film such that the first thin film performs a role as a buffer against the heat.

2. The internal member of claim 1, wherein the second metal material includes at least one selected from the group consisting of aluminum (Al), titanium (Ti), molybdenum (Mo), tungsten (W), tantalum (Ta) and chromium (Cr).

3. The internal member of claim 1, wherein the coating structure has a roughness ranging from about 10 μm to about 40 μm.

4. The internal member of claim 1, wherein a difference between a thermal expansion coefficient of the first metal material and that of the second metal material is within about ±10%.

5. The internal member of claim 1, wherein the first thin film has the roughness ranging from about 10 μm to about 40 μm.

6. The internal member of claim 5, wherein the inner surface of the chamber structure making contact with the first thin film has a roughness ranging from about 2 μm to about 10 μm.

7. The internal member of claim 5, wherein the first thin film has a porosity ranging from about 6% to about 12% and the second thin film has a porosity ranging from about 2% to about 8%.

8. The internal member of claim 5, wherein the first thin film has a thickness ranging from about 50 μm to about 500 μm and the second thin film has a thickness ranging from about 20 μm to about 80 μm.

9. The internal member of claim 1, wherein the coating structure includes a third thin film on the inner surface and in an assembly area in which parts are assembled with each other, the third thin film having a roughness ranging from about 2 μm to about 10 μm, and the parts including the object supporting unit and the target supporting unit.

10. The internal member of claim 9, wherein the third thin film has a thickness ranging from about 20 μm to about 300 μm.

11. The internal member of claim 1, wherein the roughness of the first thin film is same as that of the second thin film.

12. The internal member of claim 1, wherein the first thin film includes an intermediate metal material of which a thermal expansion coefficient is lower than or same as that of the inner surface of the chamber structure.

13. A method of manufacturing an internal member for an apparatus of depositing a conductive thin film, the method comprising:
   preparing a chamber structure, the chamber structure including an object supporting unit supporting an object on which the conductive thin film is to be deposited, and a target supporting unit supporting a target for depositing the conductive thin film on the object, the target including a first metal material, and the chamber structure having a reaction space therein; and
   coating an inner surface exposed to the reaction space with a second metal material to form a coating structure on the inner surface, the second metal material having at least one metal element included in the first metal material of the target,
   wherein the coating structure comprises:
     a first thin film formed on the inner surface of the chamber structure; and
     a second thin film formed on the first thin film, the second thin film including the second metal material, wherein a roughness formed by the first thin film is maintained in the second thin film, and
   wherein a thermal expansion coefficient of the first thin film is lower than or same as that of the chamber structure, and is higher than or same as that of the second thin film for preventing heat generated in the reaction space from being transferred to the inner surface of the chamber,
   wherein a porosity of the first thin film is higher than or same as that of the second thin film such that the first thin film performs a role as a buffer against the heat.

14. The method of claim 13, wherein the coating an inner surface is formed by any one method among a plasma spray method, a high velocity oxygen fuel spray method (HVAF), a high velocity air fuel spray method (HVAF).

15. The method of claim 13, wherein the second metal material includes at least one selected from the group consisting of aluminum (Al), titanium (Ti), molybdenum (Mo), tungsten (W), tantalum (Ta) and chromium (Cr).

16. The method of claim 13, before coating the inner surface with the second metal material, further comprising:
   blasting processing the inner surface exposed to the reaction space to form a blasted inner surface having a roughness ranging from about 2 µm to about 10 µm.

* * * * *